(12) United States Patent
Sigi et al.

(10) Patent No.: US 11,279,120 B2
(45) Date of Patent: Mar. 22, 2022

(54) DEVICE AND METHOD FOR DEBONDING A STRUCTURE FROM A MAIN SURFACE REGION OF A CARRIER

(71) Applicant: Infineon Technologies AG, Neubiberg (DE)

(72) Inventors: Alfred Sigi, Sinzing (DE); Dominic Maier, Pleystein (DE); Daniel Porwol, Straubing (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 247 days.

(21) Appl. No.: 16/504,811

(22) Filed: Jul. 8, 2019

(65) Prior Publication Data
US 2020/0023630 A1 Jan. 23, 2020

(30) Foreign Application Priority Data
Jul. 18, 2018 (EP) ..................... 18184213

(51) Int. Cl.
*B32B 41/00* (2006.01)
*B32B 38/10* (2006.01)
*B32B 38/18* (2006.01)

(52) U.S. Cl.
CPC .............. *B32B 38/10* (2013.01); *B32B 38/18* (2013.01)

(58) Field of Classification Search
CPC .... H01L 21/67132; B32B 38/10; B32B 38/18
USPC ............... 156/60, 64, 350, 351, 378, 379
See application file for complete search history.

(56) References Cited

U.S. PATENT DOCUMENTS

| | | | |
|---|---|---|---|
| 6,136,142 A * | 10/2000 | Kitagawa | B32B 37/226 100/176 |
| 2006/0219359 A1* | 10/2006 | Miyamoto | H01L 21/67132 156/716 |
| 2007/0261783 A1 | 11/2007 | Larson et al. | |
| 2007/0284038 A1 | 12/2007 | Yamamoto et al. | |
| 2008/0011412 A1 | 1/2008 | Tsujimoto et al. | |
| 2008/0017311 A1 | 1/2008 | Yoshioka et al. | |
| 2011/0207328 A1* | 8/2011 | Speakman | H01L 51/0016 438/694 |

(Continued)

FOREIGN PATENT DOCUMENTS

| | | |
|---|---|---|
| JP | H1145934 A | 2/1999 |
| JP | 2003324142 A | 11/2003 |
| JP | 2009088397 A | 4/2009 |

(Continued)

*Primary Examiner* — Michael N Orlando
*Assistant Examiner* — Joshel Rivera
(74) *Attorney, Agent, or Firm* — Slater Matsil, LLP

(57) ABSTRACT

A device for debonding a structure from a main surface region of a carrier includes a tape for laminating to the structure, a first holder and a second holder for spanning the tape and to keep a tension of the tape. The second holder can be movable into a lifted position vertically offset to the main surface region of the carrier. The device can also include a deflecting-element for providing a deflection-line between the first holder and the second holder for deflecting the tape in response to moving the second holder into the lifted position. The deflecting-element can be moveable parallel to the carrier for moving the deflection-line parallel to the carrier and for debonding the structure, laminated to the tape, from the carrier.

14 Claims, 7 Drawing Sheets

(56) References Cited

U.S. PATENT DOCUMENTS

2013/0062020 A1  3/2013  Ries et al.

FOREIGN PATENT DOCUMENTS

| JP | 2013168616 A | 8/2013 |
| JP | 2016181613 A | 10/2016 |
| KR | 20160055338 A | 5/2016 |

* cited by examiner

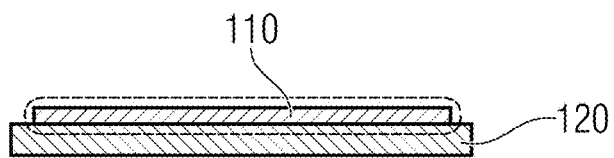
Fig. 3a
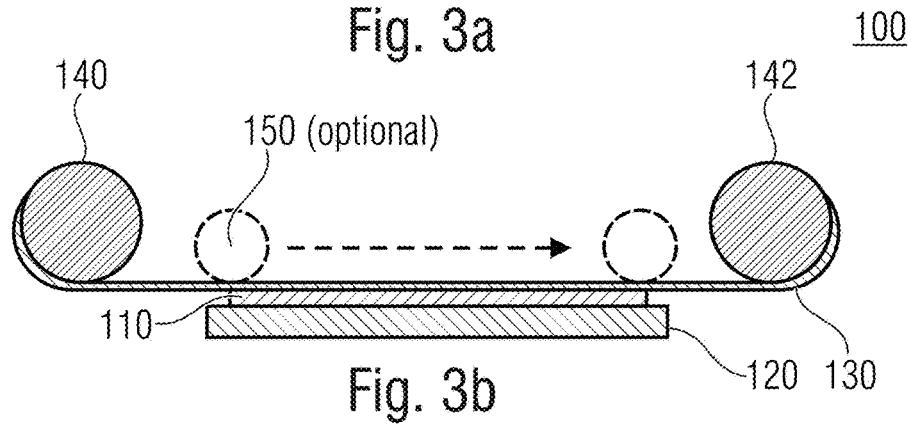
Fig. 3b
Fig. 3c
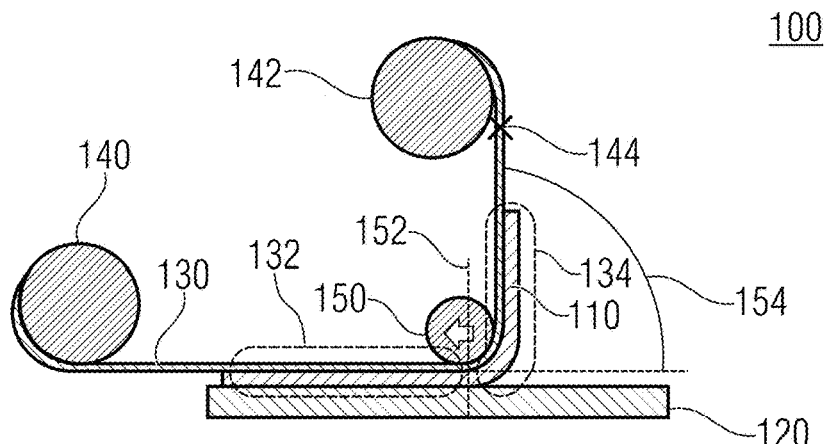
Fig. 3d
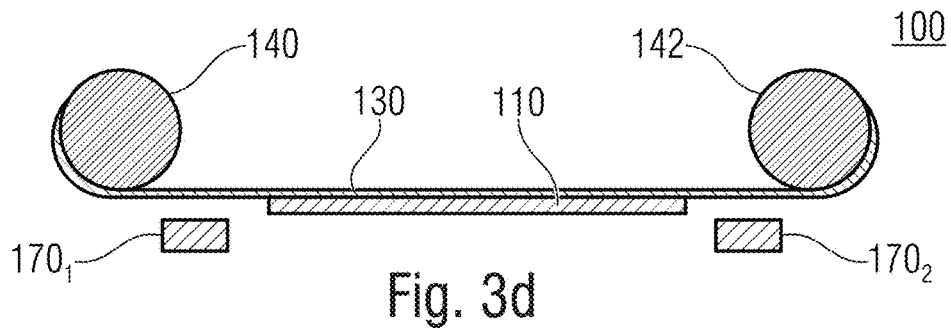
Fig. 3e
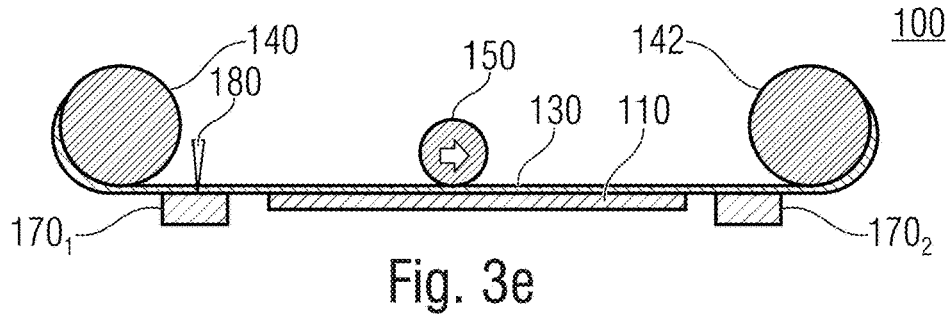

DEVICE AND METHOD FOR DEBONDING A STRUCTURE FROM A MAIN SURFACE REGION OF A CARRIER

This application claims the benefit of European Application No. 18184213, filed on Jul. 18, 2018, which application is hereby incorporated herein by reference.

TECHNICAL FIELD

Embodiments of the disclosure relate to a device and a method for debonding a structure from a main surface region of a carrier.

BACKGROUND

Structures, devices or thin wafers have to be transferred from a carrier wafer to film frame. In thin wafer handling technology there is residual force to overcome to lift the structures from the carrier wafer. Lifting the devices from a wafer at debonding is done by the following movements: slide off, wedge debond, and parallel lifting (no angle between carrier and device).

Usually the structures, devices or thin wafers are lifted all at once without or with only very little bending. Therefore, the overall needed force that the tool has to apply at debonding is very high.

SUMMARY

An embodiment is related to a device for debonding a structure from a main surface region of a carrier. The device comprises, for example, a tape for laminating to the structure, a first holder and a second holder for spanning the tape and to keep a tension of the tape. At least the second holder can be movable into a lifted position vertically offset to the main surface region of the carrier. The device can also comprise a deflecting-element for providing a deflection-line arranged between the first holder and the second holder for deflecting the tape in response to moving the second holder into the lifted position. The deflecting-element can be arranged to be moveable parallel to the carrier for moving the deflection-line parallel to the carrier and for debonding the structure, laminated to the tape, from the carrier.

An embodiment is a method for debonding a structure from a main surface region of a carrier. The method can comprise the steps laminating a tape to the structure, spanning the tape between a first holder and a second holder to keep a tension of the tape, moving the second hold into a lifted position vertically offset to the main surface region of the carrier, setting a deflecting-element on the tape towards a first end of the structure, providing a deflection-line arranged between the first hold and the second holder to deflect a tape in response to moving the second hold into the lifted position and moving the deflecting-element parallel to the carrier from the first end of the structure to a second end of the structure for moving the deflection-line parallel to the carrier, whereby the structure, laminated to the tape, is debonded from the carrier.

The method as described above can be based on the same considerations as the above-described device. The method can, by the way, be completed with all features and functionalities, which are also described with regard to the device.

BRIEF DESCRIPTION OF THE DRAWINGS

The drawings are not necessarily to scale, emphasis instead generally being place upon illustrating the principles of aspects of the disclosure. In the following description, various embodiments are described with reference to the following drawings, in which:

FIG. 3a shows a schematic view of a structure on a main surface region of a carrier, wherein the structure is a thin wafer according to an embodiment;

FIG. 3b shows a schematic view of a device with a tape laminated to a structure, wherein the structure is a thin wafer according to an embodiment;

FIG. 3c shows a schematic view of a device arranged for debonding a structure, wherein the structure is a thin wafer according to an embodiment;

FIG. 3d shows a device with a structure debonded from a carrier, wherein the structure is a thin wafer according to an embodiment;

FIG. 3e shows a device arranged for laminating a tape with a structure on a tape frame, wherein the structure is a thin wafer according to an embodiment;

DETAILED DESCRIPTION OF ILLUSTRATIVE EMBODIMENTS

Figure 1:
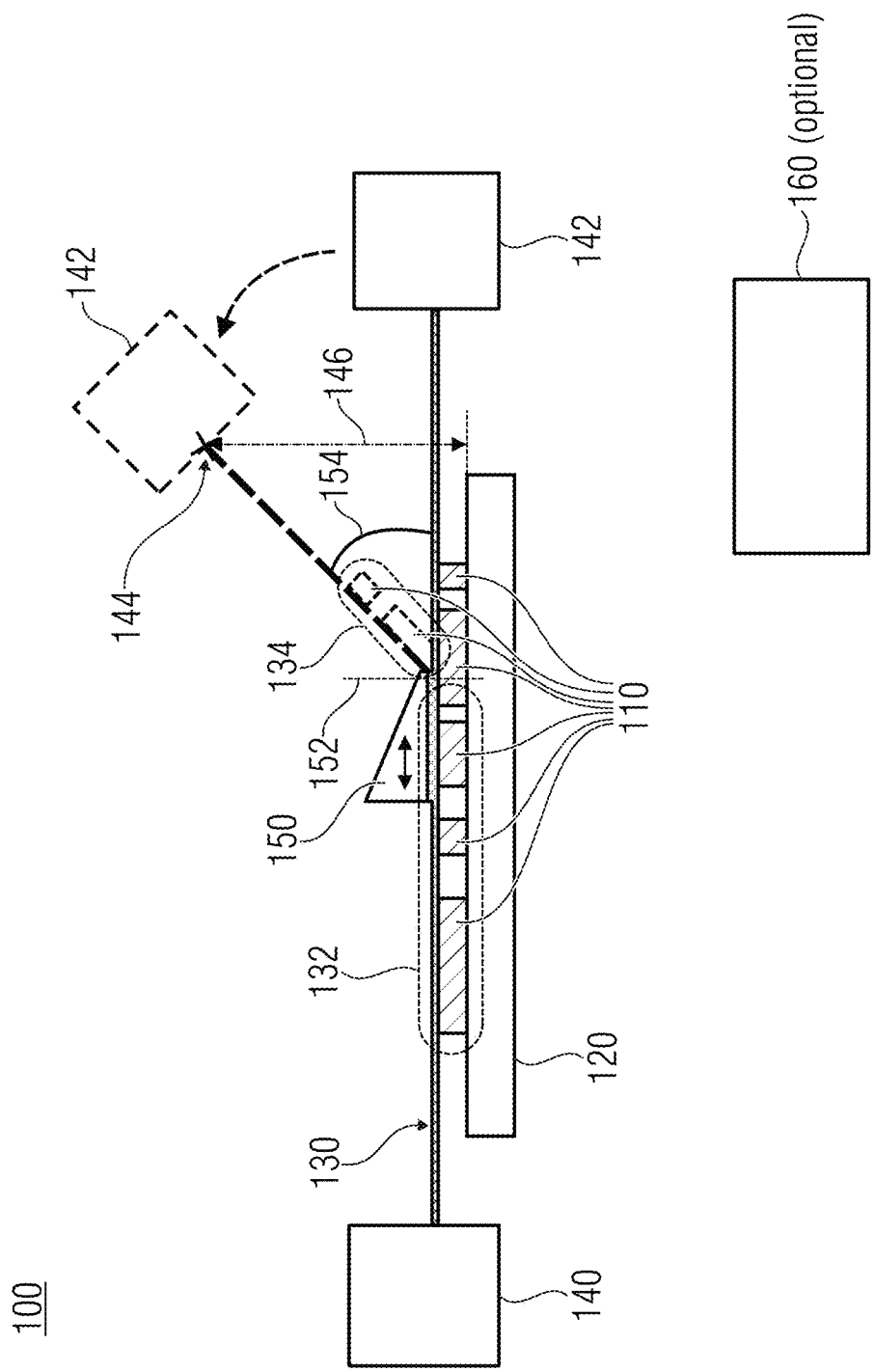
FIG. 1 shows a schematic view of a device according to an embodiment.

Equal or equivalent elements or elements with equal or equivalent functionality are denoted in the following description by equal or equivalent reference numerals even if occurring in different figures.

In the following description, a plurality of details is set forth to provide a more thorough explanation of embodiments of the disclosure. However, it will be apparent to those skilled in the art that embodiments may be practiced without these specific details. In other instances, well-known structures and devices are shown in block diagram form rather than in detail to avoid obscuring embodiments. In addition, features of the different embodiments described herein after may be combined with each other, unless specifically noted otherwise.

Embodiment concepts described below achieve a better compromise between reducing a force applied by a tool at debonding and optimizing a transfer of a debonded structure from a carrier/wafer to a new destination when compared to prior art solutions.

FIG. 1 shows a device 100 for debonding a structure 110 from a main surface region of a carrier 120.

The embodiment of FIG. 1 advantageously exploits embodiment concepts that a force applied by the device 100 to debond the structure 110 from the main surface region of the carrier 120 can be reduced by deflecting the tape 130. The deflection of the tape 130 can result in a peeling of the structure 110 off the main surface region of the carrier 120 instead of tearing the structure 110 from the main surface region of the carrier 120 by the device 100, whereby less stress is caused in the structure 110 by the device 100 at debonding. Thus, a transfer of the structure 110 from the main surface region of the carrier to the tape 130 is optimized by the device 100.

The device 100 comprises, for example, a tape 130 for laminating to the structure 110, a first holder 140 and a second holder 142 for spanning the tape 130 and to keep a tension of the tape 130. At least the second holder 142 can be movable into a lifted position 144 vertically offset 146 to the main surface region of the carrier 120. Thus, the first holder 140 and the second holder 142 can prevent the tape 130 from dipping by spanning the tape 130. The vertical offset 146 of the lifted position 144 to the main surface region of the carrier 120 can define a distance between the lifted position 144 and the main surface region of the carrier 120 perpendicular to the main surface region of the carrier 120. The lifted position 144 can, for example, be in a plane parallel to the main surface region of the carrier 120 with a vertical offset 146 to the main surface region of the carrier 120, wherein the vertical offset 146 is, for example, continuously adjustable.

The device 100 can also comprise a deflecting-element 150 for providing a deflection-line 152 arranged between the first holder 140 and the second holder 142 for deflecting the tape 130 in response to moving the second holder 140 into the lifted position 144. The deflection-line 152 at a position of the deflecting-element 150 can divide the tape 130 into two portions. Thus, for example, a first portion of the two portions can be arranged parallel to the main surface region of the carrier 120 and a second portion of the two portions, can connect the first portion with the lifted position 144, whereby the tape 130 can be deflected at the deflection-line 152. Thus, the second portion can, for example, define a deflection-angle 154 between the main surface region of the carrier and the second portion of the tape.

The deflecting-element 150 can be arranged to be moveable parallel to the carrier 120 for moving the deflection-line 152 parallel to the carrier 120 and for debonding the structure 110, laminated to the tape 130, from the carrier 120. Thus the structure 110 is, for example, transferred from the main surface region of the carrier 120 to the tape 130 at the deflection-line 152. The deflecting-element 150 is, for example, particularly movable parallel to the main surface region of the carrier 120.

The first holder 140 and the second holder 142 are shown in FIG. 1 as boxes. Thus, for example, the second holder 142 can be movable into the lifted position 144 in such a way that a tension of the tape 130 is kept or, for example, the first holder 140 or the second holder 142 can comprise a moving element connected to the tape 130 to elongate or shorten the tape 130 to keep the tension of the tape 130.

According to an embodiment, the first holder 140 and/or the second holder 142 can be arranged to keep the tension of the tape 130 constant. By keeping the tension of the tape 130 constant it is possible to debond the structure 110 from the main surface region of the carrier 120 by the device 100 in a controlled way. The constant tension of the tape 130 also can be advantageous in terms of reducing possible stress to the structure 110, when the structure sticks (is laminated) to the tape 130. Thus longitudinal and vertical stress in the structure 110 can be reduced.

If the tape 130, for example, experiences a changing tension like a higher tension than before the change, the structure 110 can experience a tensile stress and the structure 110 can experience a compression stress, if the tape 130 comprises a smaller tension than before the change. Thus with a constant tension of the tape 130 stress can be reduced in the structure 110.

According to an embodiment, the first holder 140 and/or the second holder 142 can be a roll, in particular a rotatable roll. Thus, the tape 130 can be rolled onto the first holder 140 and/or the second holder 142 and be spanned, by rotating the first holder 140 and/or the second holder 142. If a first holder 140 or the second holder 142 is realized as a roll, it is possible to adjust the tension of the tape 130 easily by rotating the first holder 140 and/or the second holder 142.

According to an embodiment, the second holder 142 can be configured to be movable in a direction with a first component parallel to the main surface region of the carrier 120 and a second component perpendicular to the main surface region of the carrier 120. In other words, the second holder 142 can be movable along a vector with the first component and the second component. Thus, the second holder 142 can be moved diagonal to the carrier 120. Thus, it is possible to keep the tension of the tape 130 and, for example, keep the length of the tape 130 constant. Thus, the second holder 142 can keep the tension of the tape 130, for example, without an element to lengthen or shorten the tape 130. With this functionality, the tension of the tape 130 can be kept by the movement of the second holder 142.

Optionally, the first holder 140 and/or the second holder 142 can be realized as a hook. According to an embodiment, it is also possible to realize the first holder 140 and/or the second holder 142 as a plane or a three-dimensional body with an adhesive connection to the tape 130 or a connection with a suction control to the tape 130 or a connection with a hook-and-loop fastener to the tape 130. The first holder 140 and/or the second holder 142 can also comprise two plates to grip the tape 130 between the two plates. This list of embodiments of the first holder 140 and/or the second holder 142 is to be regarded as exemplarily and not as exhaustive.

According to an embodiment, the deflecting-element 150 is a wedge as shown in FIG. 1, in particular a wedge comprising a rounded corner being a corner at the deflection line 152 or a roll, in particular a rotatable roll. The radius of the rounded corner of the wedge 150 or the diameter of a rotatable roll can be individually changed. The smaller the radius or the diameter of the deflecting-element 150 gets, the bigger the angle 154 can get between the tape 130 without a deflection and the tape 130 deflected by the movement of the second holder 142 into the lifted position 144. The bigger the angle 154 gets, the easier can the structure 110 be debonded from the main surface region of the carrier 120. Thus, the deflecting-element (for example the diameter of the roll or the radius of the wedge) can be chosen such that an optimized trade-off between a deflection of the tape 130 allowed for the structure 110, caused by the deflection of the tape 130, and an optimal angle 154, to debond the structure 110 from the carrier 120 with only a small force, should ideally be considered.

The diameter of the roll or the wedge (an example of the deflecting-element 150) can for example be defined in a range of 1 mm to 20 cm, 3 mm to 10 cm or 5 mm to 5 cm. Thus, it is possible to use, for example, a roll with a diameter of about 15 cm as a deflecting-element 150, if the structure 110 is, for example, allowed only a small deflection without cracking. If the structure 110 is flexible, a big deflection-angle 154 can, for example, be realized by a wedge with a rounded corner with a radius of about 5 mm, as a deflecting-element to debond the flexible structure 110 of the carrier 120 with a small force. Thus, it is possible to individualize the device 100 for different structures to be debonded.

The deflecting-element 150 can, for example, stabilize the debonding of the structure 110 from the carrier 120. So, the structure 110 is, for example, debonded by the device 100 only at the deflection-line 152 one part after the other and not the complete structure in one movement.

According to an embodiment, the deflection-line 152 separates a first portion 132 of the structure 110 bonded to the carrier 120 and laminated to the tape 130 and a second portion 134 of the structure 110 debonded from the carrier 120 and transferred/laminated to the tape 130. Thus, the deflection-line 152 can define a place, at which the device debonds the structure 110 from the carrier 120. In other words the deflection-line 152 can define a position, at which the structure 110 is transferred from the carrier 120 to the tape 130.

Optionally, the deflection-angle 154 can be defined by the first portion 132 and the second portion 134. Thus, the deflection-angle 154 can be defined as 180° minus a sharp angle between the first portion 132 of the structure 110 and the second portion 134 of the structure 110.

According to an embodiment, the second holder 142 can also be laterally movable with respect to the main surface of the carrier 120, wherein a deflection-angle 154 of the tape 130 at the deflection-line 152 is adjustable based on a subsequent or simultaneous combination of the lateral and vertical movement of the second holder 142 and on the lateral position of the deflecting-element 150. Thus, the deflection-angle 154 can be changed by, for example, moving the second holder 142 in the lifted position 144 and by moving the deflecting-element 150 parallel to the main surface region of the carrier 120.

The structure 110 can, for example, be debonded from the carrier 120 by setting the first holder 140 at the first position and the second holder 142 at the lifted position 144 and by just moving the deflecting-element 150 parallel to the carrier 120. Thus, the structure 110 can be debonded from the carrier 120 by the device 100 with a changing deflection-angle 154 while debonding. It is also possible to debond the structure 110 from the carrier 120 with a constant deflection-angle 154. Thus, for example, the deflecting-element 150 and the second holder 142 can both change their position while debonding. Therefore, for example, the deflecting-element 150 moves parallel to the carrier 120 and the second holder 142 changes its lifted position 144 by, for example, moving vertically and laterally with respect to the main surface of the carrier 120.

According to an embodiment, the deflection-angle 154 can lie in between 10° and 170°, 15° and 120° or 20° and 90°. The bigger the angle 154, the easier it is to debond the structure 110 from the carrier 120, because less force is needed. With the defined deflection-angle 154, it is possible to debond the structure 110 from the carrier 120 with less force and thus very efficiently.

According to an embodiment, the deflecting-element 150 can be configured to control the deflection-angle 154, by the diameter of a roll or a radius of a rounded corner of a wedge, which can be used as a deflecting-element 150. Thus, the diameter or the radius can define the largest possible deflection-angle 154 for the device 100. According to an embodiment, the smaller the radius or diameter gets, the bigger the deflection-angle 154 can be chosen.

The device 100 can, for example, comprise a controller, which can, for example, control the movement of the second holder 142, the movement of the deflecting-element 150 and, optionally, of the first holder 140. The controller 160 can, for example, comprise connection lines to the first holder 140, the second holder 142 and the deflection element 150 or can be configured to communicate with the first holder 140, the second holder 142 and the deflecting-element 150 wirelessly. The controller can control, for example, the movements of the first holder 140, the second holder 142 and the deflecting-element 150 such that the tape 130 is spanned and kept under tension. The controller 160 can, for example, control the movements such that the deflection-angle 154 is kept constant and the tension of the tape 130 is kept.

Optionally, the deflecting-element 150 can be configured to control the speed for debonding the structure 110 from the carrier 120 by the device. For example, by moving the deflecting-element 150 parallel to the carrier 120, the deflection-line 152 changes its position with time. The faster the deflection-line 152 changes its position, the faster the structure 110 is debonded from the carrier 120 at the deflection-line 152.

According to an embodiment, the structure 110, to be debonded, can be flexible and can comprise polymer devices or silicon, with an elongation perpendicular to the carrier 120 smaller than 50 µm, 30 µm or 20 µm. A flexible structure 110 can be understood as a structure 110, which is able to follow the radius of curvature of the deflecting-element 150 without cracking. Thus, for example, if the deflecting-element 150 is a roll, flexible can mean that the structure 110 can follow the diameter of the roll and if the deflecting-element 150 is a wedge, flexible can, for example, mean that the structure 110 is able to follow the radius of the rounded corner. According to an embodiment, the structure 110 can be a flexible layer of silicon, a brittle layer or a flexible metal layer. The elongation of the structure can be understood as an elongation perpendicular to the main surface of the carrier 120. Optionally, it is also possible that the structure 110 comprises small silicon chips with an elongation perpendicular to the main surface of the carrier 120 bigger than 50 μm, wherein the silicon chips are so small in a dimension parallel to the main surface of the carrier 120, that a single chip sees only a small curvature.

In other words, the device 100 is to use a tape 130 to peel thin devices (for example the structure 110) from a carrier wafer (for example the carrier 120) and transfer them to a new destination. The thin devices can, for example, be so thin that they are flexible enough or they are made out of flexible materials. The tape 130 is, for example, glued onto the devices and peeled off the carrier 120. The devices can, for example, stick to the tape 130 and debond therefore from the carrier 120. According to an embodiment, the tape 130 can be peeled like a sticker and therefore only little overall force is needed at peeling. Thus, the device 100 can be configured for thin device debonding by tape-peeling.

The device 100 can, for example, be used for debonding devices (the structure 110) of the carrier 120. Thus, the structure 110 can, for example, be a particle filter for MEMS microphones. Thus, the device 100 can be used to debond the particle barrier for MEMS microphones from the carrier 120.

The device 100 can, for example, be used to debond semiconductor structures from a carrier 120.

In other words the devices (the structure 110) which will be debonded are so thin that they can be bent without cracking. This is, for example, the case for polymer devices or silicon below about 20 μm. First, the tape 130 (for example, a dicing tape) is glued onto the devices which should be debonded (for example, see FIG. 1, FIG. 2b, FIG. 3b, FIG. 4b, FIG. 5b or FIG. 6b). Then, the tape 130 is peeled off the carrier wafer 120 like a sticker with a small angle 154 (for example, see FIG. 1, FIG. 2c, FIG. 3c, FIG. 4c, FIG. 4d, FIG. 5c or FIG. 6c). In this way, the devices 110 debond only at the peeling front (the deflection-line 152) one after the other. A roller (for example, the deflecting-element 150) can be used to control the peeling front 152 in speed and bending angle 154. The dimension of the roller 150 can define the bending angle 154 of the devices 110. When all devices 110 are debonded from the carrier wafer 120, all devices 110 are on the tape 130. This tape can now be used to transfer the devices to another destination. According to an embodiment, it can be laminated to a film frame (for example, a tape frame 170₁, 170₂ as shown in FIG. 2d, FIG. 2e, FIG. 3d, FIG. 3e, FIG. 5d, Figure 5e or FIG. 6d, FIG. 6e). In this shape, the devices 110 can be delivered to a customer. It (e.g. the structure 110) can be aligned and pressed to a new wafer (e.g. carrier 120) with, for example, other devices and adhesive on top to transfer the devices to this new devices wafer. In case a UV-tape/thermal tape (tape 130) was used, the devices 110 can be released from the transfer tape 130 at the new destination by UV-irradiation/thermal treatment. The core is to use the tape 130 for peeling thin devices 110 from a carrier wafer 120 and transfer it to a new destination.

Figure 2A:
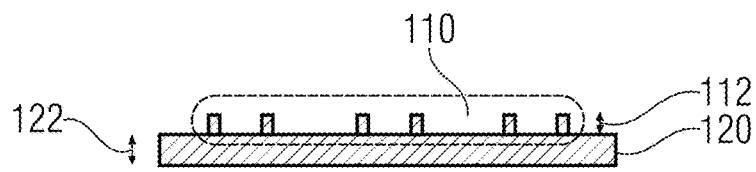
FIG. 2a shows a schematic view of a structure on a main surface region of a carrier according to an embodiment.

FIG. 2a shows a carrier 120, which can also be understood as a carrier wafer in the following. The carrier 120 can, for example, comprise silicon material or glass material with, for example, a thickness 122 of about 700 μm. The thickness 122 of the carrier 120 is perpendicular to the main surface of the carrier 120. The thickness of the carrier 120 can lie in the range of 100 μm to 5 mm, 300 μm to 1 mm or 500 μm to 900 μm.

A structure 110 can be arranged on the carrier 120. The structure 110 can, for example, comprise devices. According to an embodiment, the structures 110 can comprise a dimension 112 perpendicular to the carrier 120 of about 45 μm. The dimension 112 can also be in the range of 5 μm to 100 μm, 10 μm to 60 μm or 20 μm to 50 μm. According to an embodiment, the structure 110 can comprise polymeric structures.

The structure 110 can comprise, for example, a predetermined breaking point or a glue connection to the main surface region of the carrier 120.

Figure 2B:
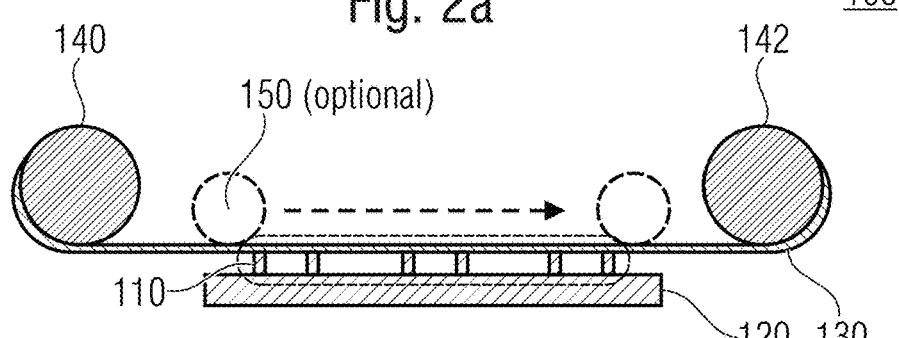
FIG. 2b shows a schematic view of a device with a tape laminated to a structure according to an embodiment.

FIG. 2b shows the device 100 with a first holder 140, a second holder 142, a tape 130 and, optionally, a deflecting-element 150. FIG. 2b shows a step of laminating the tape 130 to the structure 110. The device 100 can use, for example, the deflecting-element 150 to laminate the tape 130 to the structure 110. For that, the tape 130 is, for example, spanned between the first holder 140 and the second holder 142 and glued to the structure 110 by, for example, rolling the deflecting-element 150 (which is, for example, a roll) from one end of the structure 110 to the other end of the structure 110.

The first holder 140 and the second holder 142 can, for example, span the tape 130 in such a way, that the tension is kept in terms of keeping a longitudinal and transversal stress.

Figure 2C:
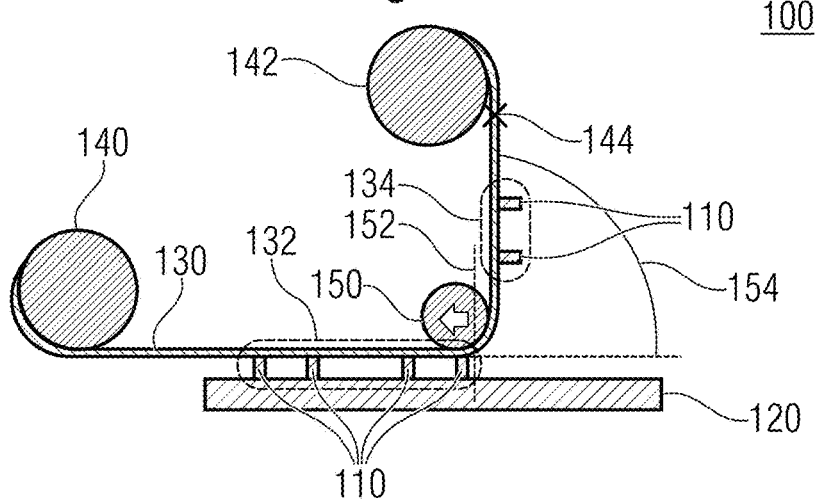
FIG. 2c shows a schematic view of a device arranged for debonding a structure according to an embodiment.

If the tape 130 is, for example, laminated to the structure 110 by other means, for example, by heat or UV-radiation, the device 100 can, for example, withdraw the deflecting-element 150 and, for example, use the deflecting-element 150 in the next step shown in FIG. 2c.

According to an embodiment, FIG. 2b shows the lamination of, for example, dicing tape 130 over the structures 110. According to an embodiment, it is possible that the dicing tape 130 will touch the wafer (the carrier 120) front side.

FIG. 2c shows a next step performed by the device 100. The device 100 shown in FIG. 2b, FIG. 2c, FIG. 2d and FIG. 2e can comprise the same functionalities and features as the device 100 in FIG. 1.

According to an embodiment, the second holder 142 is moved into a lifted position 144, as shown in FIG. 2c, vertically offset to the main surface region of the carrier 120. The deflecting-element 150 can provide a deflection-line 152 arranged between the first holder 140 and the second holder 142 for deflecting the tape 130 in response to moving the second holder 142 into the lifted position 144. Thus, the tape 130 is, for example, deflected in such a way, a portion of the tape 130 deflected by the deflecting-element 150 laminated to a second portion 134 of the structure 110 and a plane parallel to the main surface of the carrier 120 holds a deflection-angle 154 of about 90°. Thus, for example, the second portion 134 of the structure 110 is already debonded from the carrier 120 and the first portion 132 of the structure 110 can be debonded by the device 100 by moving the deflecting-element 150 parallel to the main surface region of the carrier 120. In other words, FIG. 2c shows a detaping of dicing tape 130 with the structure 110 peeled off. In other words, the dicing tape 130 can be peeled from the wafer (the carrier 120) and the structure 110 can stay on the dicing tape 130.

Figure 2D:
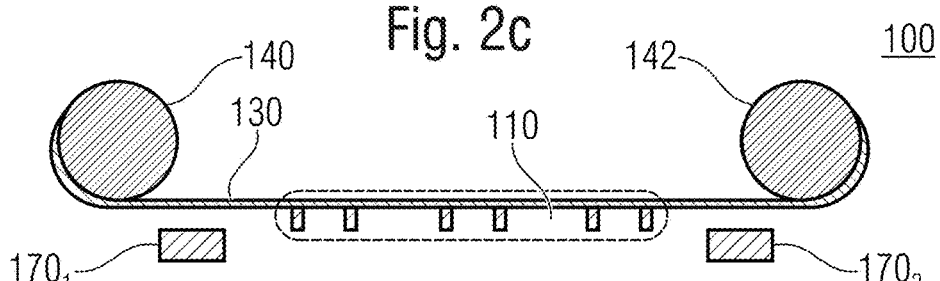
FIG. 2d shows a device with a structure debonded from a carrier according to an embodiment.

FIG. 2d shows the device 100 with the first holder 140 and the second holder 142, which are constructed to span the tape 130 between them. Furthermore, the tape 130 is laminated to the structure 110 and the structure 110 is already debonded from the carrier 120 by the device 100. At the step shown in FIG. 2d, the deflecting-element 150 of the device 100 is, for example, withdrawn by the controller 160, so that the device 100 can, for example, transfer the tape 130 with the structure 110 to a tape frame $170_1$, $170_2$.

The first holder 140 and the second holder 142 can, for example, span the tape 130 in such a way, that the tension is kept in terms of keeping a longitudinal and transversal stress.

According to an embodiment, the tape 130 can be configured to transfer the structure 110 from the carrier 120 to the tape frame $170_1$, $170_2$. The tape frame $170_1$, $170_2$ can also be understood as a dicing frame. With the tape frame $170_1$, $170_2$, the tape 130 with the structure 110 can be stabilized and thus more easily transferred to a new destination.

Figure 2E:
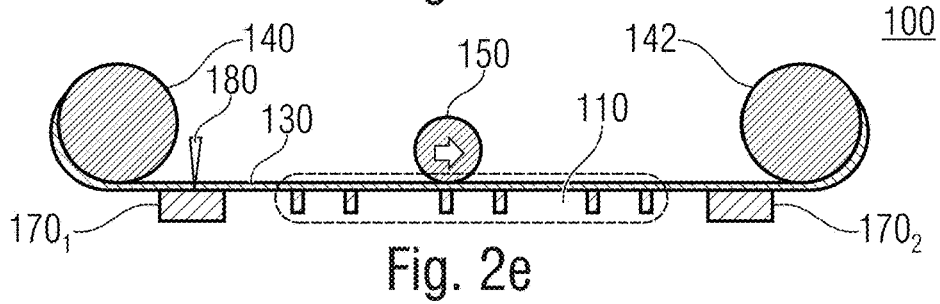
FIG. 2e shows a device arranged for laminating a tape with a structure on a tape frame according to an embodiment.

FIG. 2e shows the step of laminating the tape 130 with the structure 110 to the tape frame $170_1$, $170_2$. The deflecting-element 150 can be used to laminate the tape 130 to the tape frame $170_1$, $170_2$. Thus, the deflecting-element 150 can, for example, roll from a first tape frame $170_1$ to a second tape frame $170_2$. After the tape 130 with the structure 110 is laminated to the tape frame $170_1$, $170_2$, the tape 130 can be diced at the tape frame $170_1$, $170_2$ with a cutting element 180.

According to an embodiment, the device 100 comprises a tape frame $170_1$, $170_2$ for laminating the tape 130 with the structure 110 debonded from the carrier 120. Thus, the structure is transferred from the carrier 120 to the tape 130 and stabilized by the tape frame $170_1$, $170_2$ to transfer the structure 110 to another destination securely, with a reduction of possible damage to the structure 110.

In other words, FIG. 2b shows a first step of the device 100, a lamination of the dicing tape 130 to the structure 110, FIG. 2c shows a second step performed by the device 100, a detaping of the dicing tape 130 with a structure 110 transfer and FIGS. 2d and 2e can show a third step performed by the device 100, a lamination of the tape 130 to the tape frame $170_1$, $170_2$.

With the lamination of the structure 110 to the tape frame $170_1$, $170_2$, a following pick and place process can be enabled by the device 100.

FIGS. 3a to 3e can show the same features and functionalities as shown in FIGS. 2a to 2e. The difference between FIGS. 3a to 3e and FIGS. 2a to 2e is that the structure 110 can be a thin wafer. In other words, the carrier 120 can be a silicon wafer (for example, 700 μm) with a thin wafer (structure 110) on top. Thus, FIG. 3b shows a lamination of dicing tape 130 over the thin wafer 110, FIG. 3c shows a debonding of the thin wafer 110 of the carrier 120 by the device 100 and FIG. 3d and FIG. 3e show a lamination of the dicing tape with the thin wafer 110 debonded from the carrier 120 to the tape frame $170_1$, $170_2$.

Figure 4A:
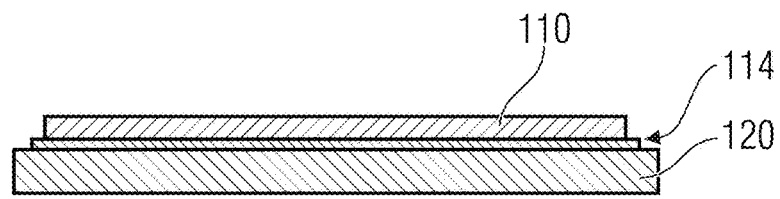
FIG. 4a shows a schematic view of a structure on a main surface region of a carrier, wherein the structure is a thin wafer glued to a carrier according to an embodiment.

FIG. 4a shows the carrier 120 with the structure 110 bonded to a main surface region of the carrier 120 by, for example, glue 114. The structure 110 can, for example, be a thin wafer. The thin wafer 110 is, according to an embodiment, temporarily bonded by the glue 114 to the main surface region of the carrier 120.

Figure 4B:
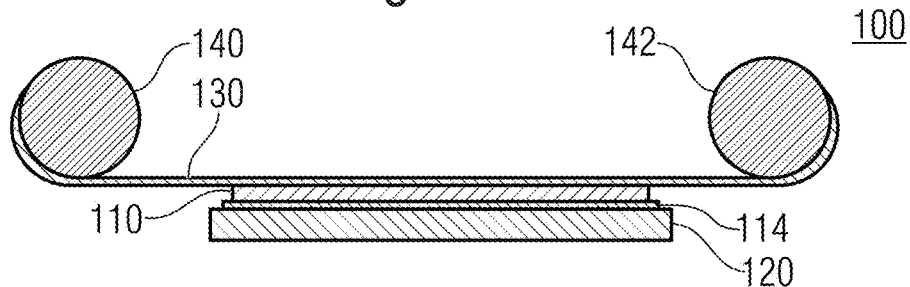
FIG. 4b shows a schematic view of a device with a tape laminated to a structure, wherein the structure is a thin wafer glued to a carrier according to an embodiment.

FIG. 4b shows the device 100 with the same features and functionalities as the device 100 shown in FIG. 2b or FIG. 3b. The difference between FIG. 4b, FIG. 2b and FIG. 3b is that the structure 110 is connected to the carrier 120 by glue 114. In FIG. 4b the device 100 laminates the tape 130 to the structure 110. It is noted that the bond between the structure 110 and the tape 130 created by the lamination of the tape 130 to the structure 110 should be stronger than the bond between the structure 110 and the carrier 120 caused by the glue 114.

Figure 4C:
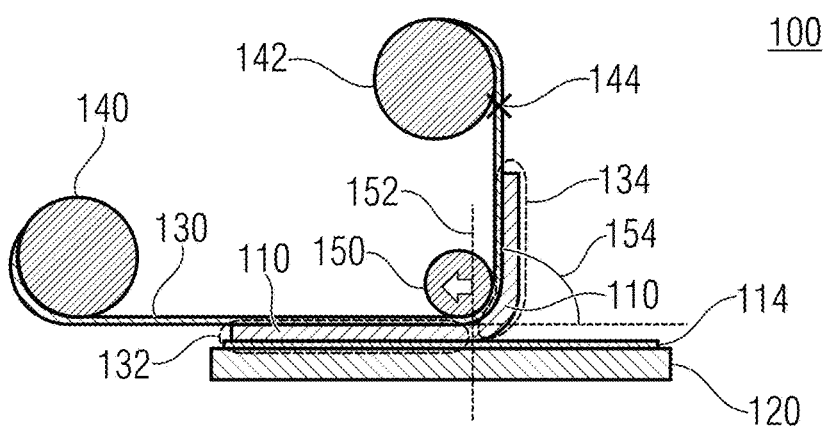
FIG. 4c shows a schematic view of a device arranged for debonding a structure, wherein the structure is a thin wafer glued to a carrier according to an embodiment.
Figure 4D:
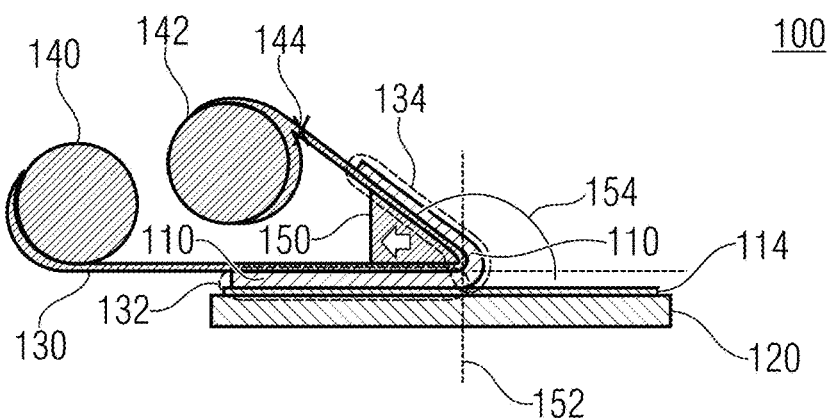
FIG. 4d shows a schematic view of a device arranged for debonding a structure, wherein the structure is a thin wafer glued to a carrier, wherein a deflecting-element is a wedge according to an embodiment.
Figure 5A:
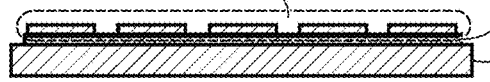
FIG. 5a shows a schematic view of a structure glued to a carrier on a main surface region of a carrier according to an embodiment.
Figure 5B:
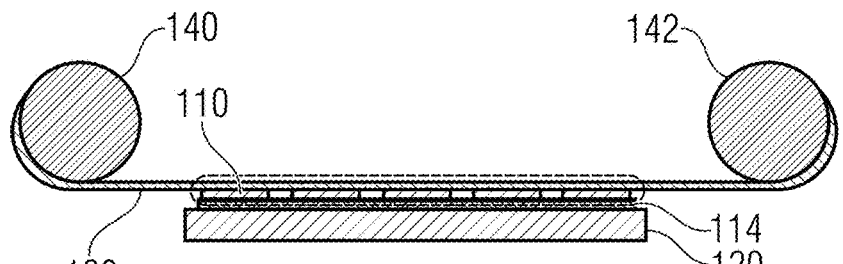
FIG. 5b shows a schematic view of a device with a tape laminated to a structure glued to a carrier according to an embodiment.
Figure 5C:
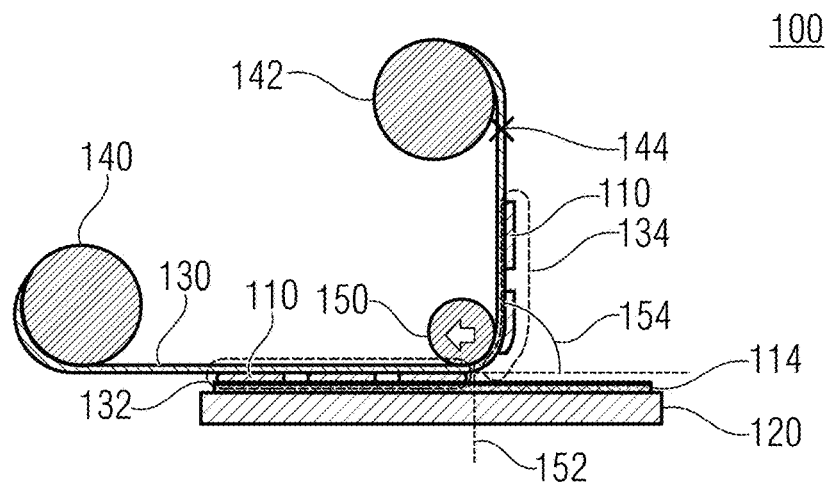
FIG. 5c shows a schematic view of a device arranged for debonding a structure glued to a carrier according to an embodiment.
Figure 5D:
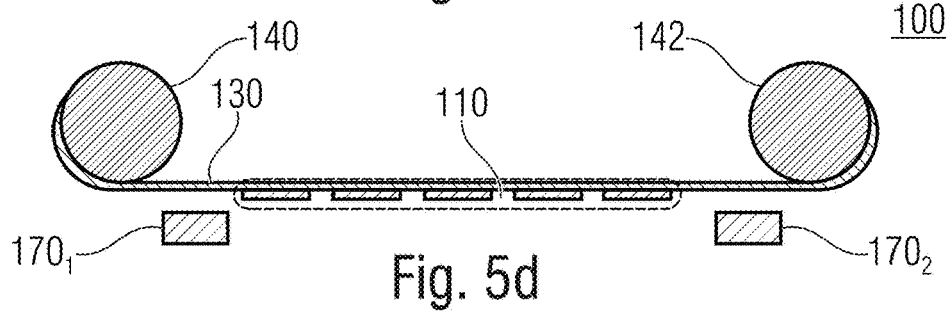
FIG. 5d shows a device with a structure glued to a carrier debonded from a carrier according to an embodiment.
Figure 5E:
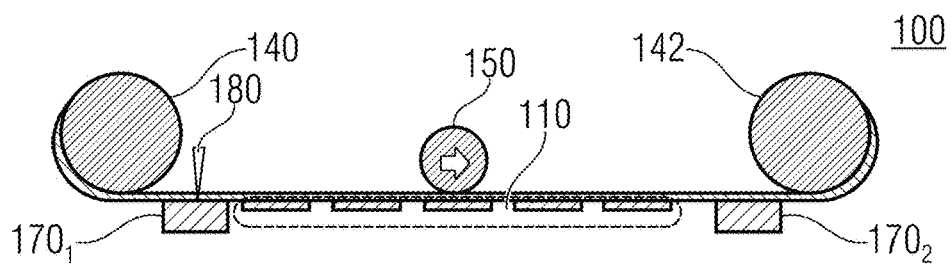
FIG. 5e shows a device arranged for laminating a tape with a structure, on a tape frame according to an embodiment.

The strength of the bond between the structure 110 and the tape 130 is especially important for the debonding step shown in FIG. 4c and FIG. 4d. The structure 110 can stick to the tape 130 stronger than to the carrier 120 to be debonded by the device 100.

FIG. 4c and FIG. 4d show the debonding of the structure 110 with the same features and functionalities as shown in FIG. 2c and FIG. 3c only with the difference that the structure 110 is arranged on the carrier 120 with glue 114 in between.

In FIG. 4c the deflecting-element 150 of the device 100 is, for example, a roll and in FIG. 4d, the deflecting-element 150 of the device 100 is, for example, a wedge. Since the wedge 150 shown in FIG. 4d comprises, for example, a smaller diameter of the rounded corner at the deflection line 152 than the diameter of the roll 150 in FIG. 4c, the deflection angle 154 in FIG. 4d can be chosen larger than in the deflection-angle 154 in FIG. 4c. According to an embodiment, the deflection-angle 154 can be 90° as shown in FIG. 4c when the deflecting-element 150 is a roll or can be up to, for example, 143°, as shown in FIG. 4d, when the deflecting-element 150 is a wedge with a smaller diameter than a diameter of a roll.

FIGS. 5a to 5e show the same features and functionalities as FIGS. 2a to 2e and FIGS. 3a to 3e with the difference that the structure 110 comprises, for example thin dies (non-built up devices) glued with glue 114 to the carrier 120. The glue 114 can also be like the glue 114 shown in FIG. 4a to FIG. 4d being for a temporary bonding of the structure 110 to the carrier 120.

FIGS. 6a to 6e show the same features and functionalities as FIGS. 2a to 2e, FIGS. 3a to 3e and FIGS. 5a to 5e with a difference that the structure 110 comprises devices connected to the carrier 120 by holding structures 116. The holding structure 116 can create a kerf below the structure 110 (between the structure 110 and the main surface region of the carrier 120). The devices in the structure 110 can, for example, be flexible particle barriers for microphones.

Figure 6A:
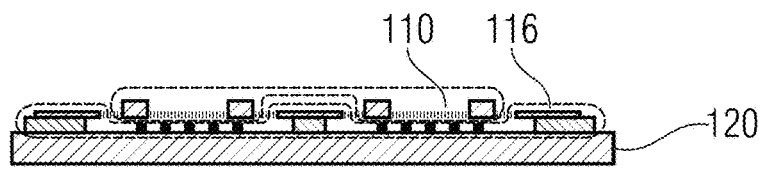
FIG. 6a shows a schematic view of a structure on a main surface region of a carrier, wherein the structure comprises devices according to an embodiment.
Figure 6B:
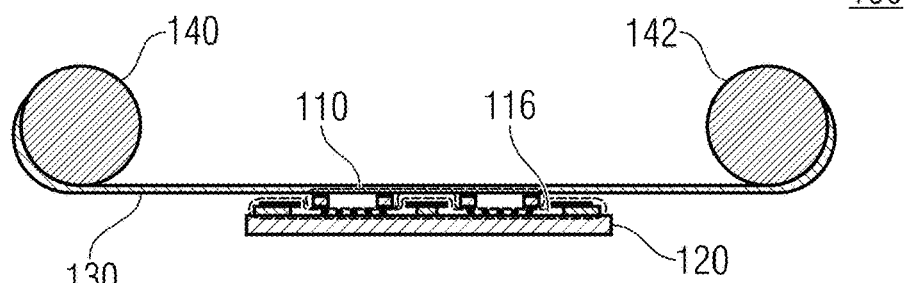
FIG. 6b shows a schematic view of a device with a tape laminated to a structure, wherein the structure comprises devices according to an embodiment.
Figure 6C:
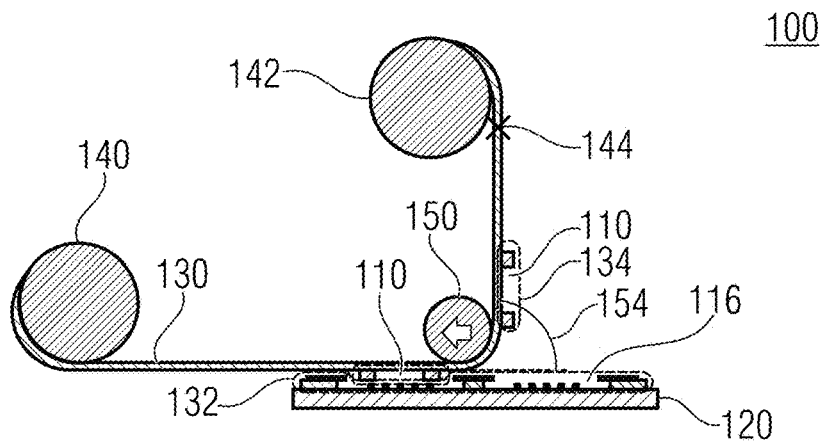
FIG. 6c shows a schematic view of a device arranged for debonding a structure, wherein the structure comprises devices according to an embodiment.
Figure 6D:
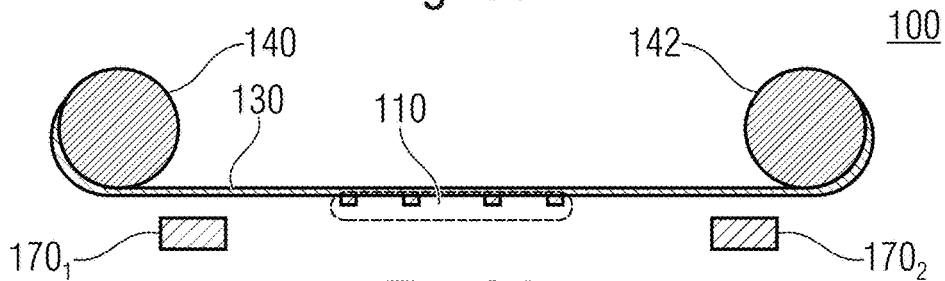
FIG. 6d shows a device with a structure debonded from a carrier, wherein the structure comprises devices according to an embodiment.
Figure 6E:
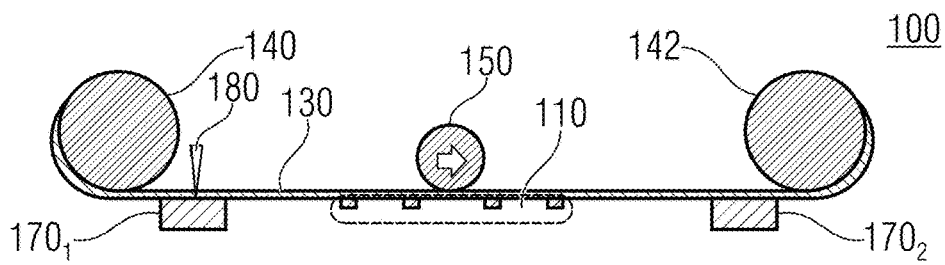
FIG. 6e shows a device arranged for laminating a tape with a structure on a tape frame, wherein the structure comprises devices according to an embodiment.

According to an embodiment, the structure 110 can be debonded from the carrier 120, as shown in FIG. 6c, by breaking the structure out of the holding structure 116, such that only the structure sticks to the tape 130 and the holding structure 116 stays at the carrier 120. There can, for example, be predetermined breaking points in the holding structure 116, where the structure 110 can be broken out of by the device 100.

Figure 7:
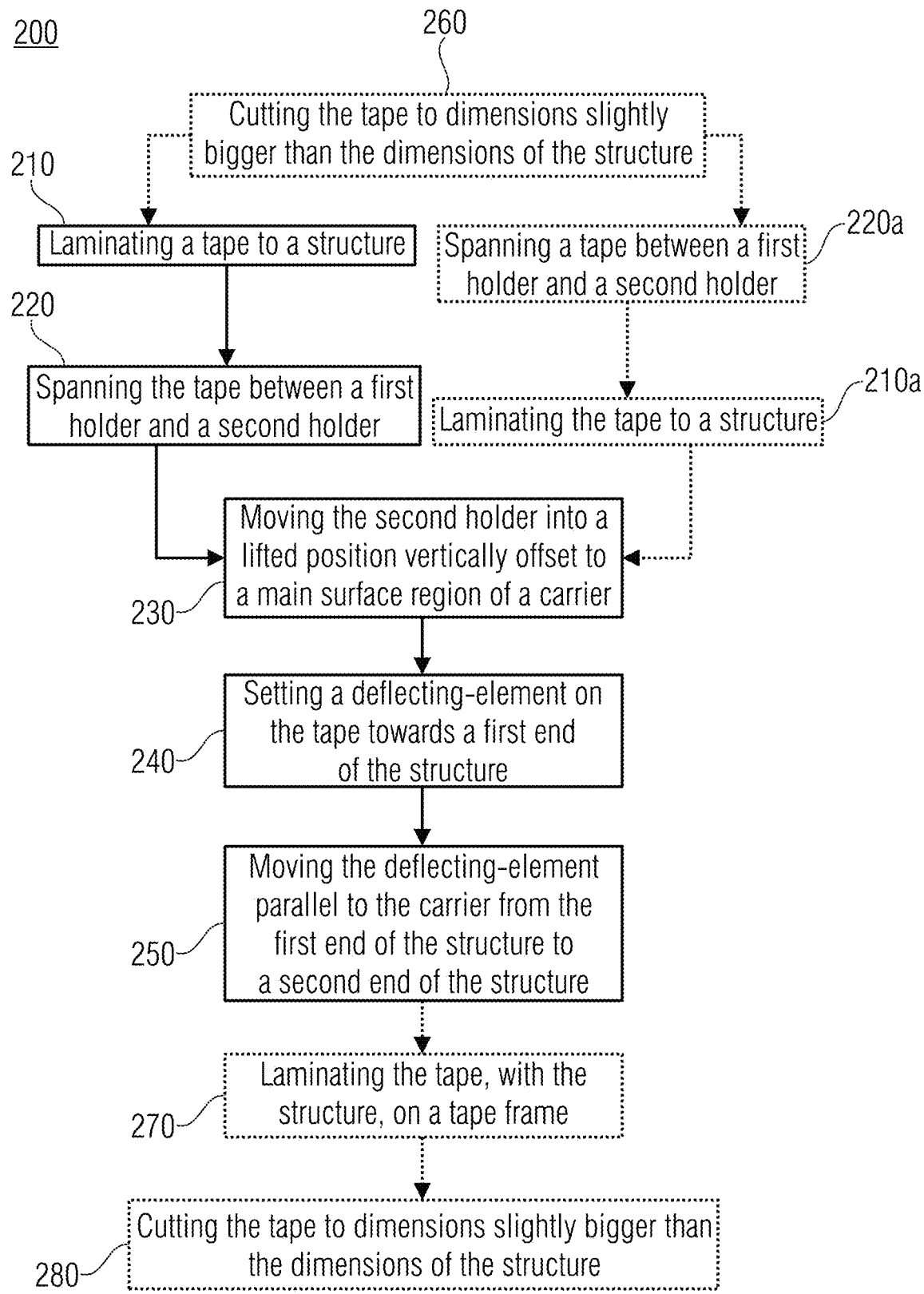
FIG. 7 shows a block diagram of a method for debonding a structure from a main surface region of a carrier according to an embodiment.

FIG. 7 shows a block diagram of a method 200 for debonding a structure from a main surface region of a carrier with the following steps:

Laminating 210 a tape to the structure; spanning 220 the tape between a first holder and a second holder to keep a tension of the tape; moving 230 the second holder into a lifted position vertically offset to the main surface region of the carrier; setting 240 a deflecting-element on the tape towards a first end of the structure, providing a deflection-line arranged between the first holder and the second holder to deflect the tape in response to moving the second holder into the lifted position and moving 250 the deflecting-element parallel to the carrier from the first end of the structure to a second end of the structure for moving the deflection-line parallel to the carrier, whereby the structure, laminated to the tape, is debonded from the carrier. By the debonding, the structure can, for example, be transferred to the tape.

Optionally, the step laminating 210 and spanning 220 can also be interchanged like shown by the step spanning 220a a tape between a first holder and a second holder, which can correspond to the step spanning 220 and the step laminating 210a the tape to a structure, corresponding to the step laminating 210.

According to an embodiment, the method 200 can comprise a step of cutting 260 the tape to dimensions slightly larger than the dimensions of the structure before the step of laminating 210 of the tape to the structure or before the step of spanning 220a a tape between a first holder and a second holder. Thus, the tape can already comprise the correct dimensions to debond the structure from the carrier 120 by the device. Thus, for example, the step shown in FIGS. 2e, 3e, 5e and 6e is only optional, because the tape can already comprise the right dimensions by the step cutting 260 and when the tape is, for example, laminated to a tape frame like shown in FIGS. 2e, 3e, 5e and 6e, the first holder and the second holder can release the tape without cutting the tape again with a cutting element.

According to an embodiment, the method 200 comprises a step of laminating 270 the tape, with the structure, on a tape frame. Thus, the structure bonded on the tape is secured in the tape frame and can be released from the device 100.

According to an embodiment, the method 200 can comprise a step of cutting 280 the tape to dimensions slightly bigger than the dimensions of the structure after the step of laminating 270 the tape, with the structure, on a tape frame.

According to an embodiment, the method 200 can comprise either the step cutting 260 or the step cutting 280. It is not necessary, that the tape is cut twice, at the beginning of the method and at the end of the method, only once, for example, at the beginning with a step cutting 260 or at the end with a step cutting 280 is enough.

According to an embodiment a device 100 for debonding a structure 110 from a main surface region of a carrier 120, can comprise a tape 130 for laminating to the structure 110; a first holder 140 and a second holder 142 for spanning the tape 130 and to keep a tension of the tape 130, wherein at least the second holder 142 is movable into a lifted position 144 vertically offset 146 to the main surface region of the carrier 120; and a deflecting-element 150 for providing a deflection-line 152 arranged between the first holder 140 and the second holder 142 for deflecting the tape 130 in response to moving the second holder 142 into the lifted position 144, wherein the deflecting-element 150 is arranged to be movable parallel to the carrier 120 for moving the deflection-line 152 parallel to the carrier 120 and for debonding the structure 110, laminated to the tape 130, from the carrier 120.

A device 100 according to an embodiment, wherein the deflecting-element 150 is a roll, in particular a rotatable roll, or a wedge, in particular a wedge comprising a rounded corner being a corner at the deflection-line 152.

A device 100 according to an embodiment, wherein the deflection-line 152 separates a first portion 132 of the structure 110 bonded to the carrier 120 and laminated to the tape 130 and a second portion 134 of the structure 110 debonded from the carrier 120 and transferred to the tape 130.

A device 100 according to an embodiment, wherein the second holder 142 is also laterally movable with respect to the main surface of the carrier 120, wherein a deflection-angle 154 of the tape 130 at the deflection-line 152 is adjustable based on a combination of the lateral and vertical movement of the second holder 142 and on the lateral position of the deflecting-element 150.

A device 100 according to an embodiment, wherein the deflection-angle 154 lies in between 10° and 170°.

A device 100 according to an embodiment, wherein the first holder 140 and/or the second holder 142 are arranged to keep a tension of the tape 130 constant.

A device 100 according to an embodiment, wherein the first holder 140 and/or the second holder 142 is a roll, in particular a rotatable roll.

A device 100 according to an embodiment, wherein the tape 130 is configured to transfer the structure 110 from the carrier 120 to a tape frame $170_1$, $170_2$.

A device 100 according to an embodiment, wherein the structure 110, to be debonded, is flexible, and comprises polymer devices or silicon, with an elongation perpendicular to the carrier 120 smaller than 50 μm.

A method 200 for debonding a structure 110 from a main surface region of a carrier 120, with the following steps:
  Laminating 210 a tape 130 to the structure 110;
  Spanning 220 the tape 130 between a first holder 140 and a second holder 142 to keep a tension of the tape 130;
  Moving 230 the second holder 142 into a lifted position 144 vertically offset 146 to the main surface region of the carrier 120;
  Setting 240 a deflecting-element 150 on the tape 130 towards a first end of the structure 110, providing a deflection-line 152 arranged between the first holder 140 and the second holder 142 to deflect the tape 130 in response to moving the second holder 142 into the lifted position 144;
  Moving 250 the deflecting-element 150 parallel to the carrier 120 from the first end of the structure 110 to a second end of the structure 110 for moving the deflection-line 152 parallel to the carrier 120 whereby the structure 110, laminated to the tape 130, is debonded from the carrier 120.

A method 200 according to an embodiment, wherein the method comprises a step of cutting the tape 130 to dimensions slightly bigger than the dimensions of the structure 110 before the step of laminating of the tape 130 to the structure 110.

A method 200 according to an embodiment, wherein the method comprises a step of laminating the tape 130, with the structure 110, on a tape frame $170_1$, $170_2$.

A method 200 according to an embodiment, wherein the method comprises a step of cutting the tape 130 to dimensions slightly bigger than the dimensions of the structure 110 after the step of laminating the tape 130, with the structure 110 on a tape frame $170_1$, $170_2$.

Although some aspects have been described as features in the context of an apparatus it is clear that such a description may also be regarded as a description of corresponding features of a method. Although some aspects have been described as features in the con-text of a method, it is clear that such a description may also be regarded as a description of corresponding features concerning the functionality of an apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, inventive subject matter may lie in less than all features of a single disclosed ex-ample. Thus the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this invention be limited only by the claims and the equivalents thereof.

What is claimed is:

1. A device for debonding a structure from a main surface region of a carrier, comprising:
   a tape for laminating to the structure;
   a first holder and a second holder for spanning the tape and to keep a tension of the tape, wherein at least the second holder is movable into a lifted position vertically offset to the main surface region of the carrier;
   a deflecting-element for providing a deflection-line arranged between the first holder and the second holder for deflecting the tape in response to moving the second holder into the lifted position, wherein the deflecting-element is arranged to be movable parallel to the carrier for moving the deflection-line parallel to the carrier and for debonding the structure, laminated to the tape, from the carrier, and wherein the deflecting-element comprises a rotatable roll; and
   a controller configured to control the movement of the second holder and configured to control the movement of the deflecting-element, wherein the controller is configured to wirelessly control the movement of the second holder and configured to wirelessly control the movement of the deflecting-element.

2. The device according to claim 1, wherein the second holder is laterally movable with respect to the main surface of the carrier, wherein a deflection-angle of the tape at the deflection-line is adjustable based on a combination of the lateral and vertical movement of the second holder and on the lateral position of the deflecting-element.

3. The device according to claim 2, wherein the deflection-angle is between 10° and 170°.

4. The device according to claim 1, wherein the first holder and/or the second holder are arranged to keep a tension of the tape constant.

5. The device according to claim 1, wherein the first holder and/or the second holder comprises a rotatable roll.

6. The device according to claim 1, wherein the tape is configured to transfer the structure from the carrier to a tape frame.

7. A method for debonding a structure from a main surface region of a carrier, the method comprising:
   laminating a tape to the structure;
   spanning the tape between a first holder and a second holder to keep a tension of the tape;
   moving the second holder into a lifted position vertically offset to the main surface region of the carrier;
   setting a deflecting-element on the tape towards a first end of the structure, providing a deflection-line arranged between the first holder and the second holder to deflect the tape in response to moving the second holder into the lifted position;
   rotating the deflecting-element parallel to the carrier from the first end of the structure to a second end of the structure for moving the deflection-line parallel to the carrier, whereby the structure, laminated to the tape, is debonded from the carrier; and
   controlling the movement of the second holder and controlling the movement of the deflecting-element by a controller, further comprising wirelessly controlling the movement of the second holder and wirelessly controlling the movement of the deflecting-element by the controller.

8. The method according to claim 7, further comprising cutting the tape to dimensions slightly bigger than the dimensions of the structure before the laminating the tape to the structure.

9. The method according to claim 7, further comprising laminating the tape, with the structure, on a tape frame.

10. The method according to claim 9, further comprising cutting the tape to dimensions slightly bigger than the dimensions of the structure after laminating the tape, with the structure, on a tape frame.

11. The method according to claim 7, wherein providing the deflection-line comprises providing a deflection-line that separates a first portion of the structure bonded to the carrier and laminated to the tape and a second portion of the structure debonded from the carrier and transferred to the tape.

12. The method according to claim 7, wherein debonding the structure comprises debonding a flexible structure comprising polymer devices or silicon having an elongation perpendicular to the carrier smaller than 50 µm.

13. The device according to claim 1, wherein the controller is configured to control the movement of the first holder.

14. The method according to claim 7, further comprising controlling the movement of the first holder by the controller.

* * * * *

UNITED STATES PATENT AND TRADEMARK OFFICE
CERTIFICATE OF CORRECTION

| | | |
|---|---|---|
| PATENT NO. | : 11,279,120 B2 | Page 1 of 1 |
| APPLICATION NO. | : 16/504811 | |
| DATED | : March 22, 2022 | |
| INVENTOR(S) | : Alfred Sigl | |

It is certified that error appears in the above-identified patent and that said Letters Patent is hereby corrected as shown below:

On the Title Page

Item (12), and Item (72) Inventors; delete "Sigi" and insert --Sigl--.

Signed and Sealed this
Eighteenth Day of October, 2022

Katherine Kelly Vidal
*Director of the United States Patent and Trademark Office*